(12) United States Patent
Eun et al.

(10) Patent No.: US 8,171,382 B2
(45) Date of Patent: May 1, 2012

(54) ENCODING SYSTEM AND METHOD FOR ENCODING ERROR CONTROL CODES WITHIN BIT STREAMS

(75) Inventors: Heeseok Eun, Seoul (KR); Jae Hong Kim, Seoul (KR); Sung Chung Park, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1037 days.

(21) Appl. No.: 12/149,214

(22) Filed: Apr. 29, 2008

(65) Prior Publication Data
US 2009/0119569 A1 May 7, 2009

(30) Foreign Application Priority Data
Nov. 6, 2007 (KR) .................. 10-2007-0112851

(51) Int. Cl.
*H03M 13/00* (2006.01)
(52) U.S. Cl. ........ 714/774; 714/746; 714/752; 714/753; 714/787; 714/788; 714/755; 714/792; 714/800; 714/761; 714/6.11; 714/6.24
(58) Field of Classification Search .................. None
See application file for complete search history.

(56) References Cited

U.S. PATENT DOCUMENTS

| | | | | |
|---|---|---|---|---|
| 5,396,504 A * | 3/1995 | Pack | ............................. | 714/755 |
| 5,745,522 A | 4/1998 | Heegard | | |
| 5,757,822 A * | 5/1998 | Fisher et al. | .................. | 714/755 |
| 6,263,468 B1 | 7/2001 | Kondo et al. | | |
| 6,265,994 B1 * | 7/2001 | Kahlman | ........................ | 341/58 |
| 6,311,304 B1 * | 10/2001 | Kwon | ............................. | 714/755 |
| 7,349,494 B2 * | 3/2008 | Yu et al. | ........................ | 375/324 |
| 2002/0126998 A1 * | 9/2002 | Shima | ............................. | 386/96 |
| 2002/0147954 A1 * | 10/2002 | Shea | ............................. | 714/755 |

FOREIGN PATENT DOCUMENTS

| | | |
|---|---|---|
| JP | 05-204751 | 8/1993 |
| KR | 1993-0001190 | 1/1993 |
| KR | 1999-058425 | 7/1999 |
| KR | 10-2000-0010353 | 2/2000 |
| KR | 10-2000-0074862 | 12/2000 |

OTHER PUBLICATIONS

PCT Search Report dated Sep. 23, 2008 for counterpart Korean application.

* cited by examiner

*Primary Examiner* — John Trimmings
(74) *Attorney, Agent, or Firm* — Harness, Dickey & Pierce, P.L.C.

(57) ABSTRACT

An encoding system for encoding error control codes may include a first encoder configured to encode an input bit stream to generate first bit streams of C-bits, where c is an integer greater than zero, and a second encoder may be configured to receive the first bit streams and shuffle data of the received first bit streams to generate second bit streams. The data shuffling of the first bit streams may adjust an error distribution of the second bit streams. An encoding method may include encoding an input bit stream to generate first bit streams of C-bits, and receiving the first bit streams and shuffling data of the received first bit streams to generate second bit streams. An error distribution of the second bit streams may be adjusted based on the data shuffling.

20 Claims, 10 Drawing Sheets

| i | D | $S_i$ | i | D | $S_i$ |
|---|---|---|---|---|---|
| 0 | 0 | B[0] | 2 | 1 | B[1] |
| 2-1 | 0 | B[(2-1)C] | 2×2-1 | 1 | B[(2-1)C+1] |

| i | D | $S_i$ | i | D | $S_i$ |
|---|---|---|---|---|---|
| 0 | 0 | B[0] | M | 1 | B[1] |
| 1 | 0 | B[C] | M+1 | 1 | B[C+1] |
| ⋮ | | | ⋮ | | |
| M-1 | 0 | B[(M-1)C] | 2M+1 | 1 | B[(M-1)C+1] |

ENCODING SYSTEM AND METHOD FOR ENCODING ERROR CONTROL CODES WITHIN BIT STREAMS

PRIORITY STATEMENT

This U.S. non-provisional patent application claims the benefit of Korean Patent Application No. 10-2007-0112851, filed on Nov. 6, 2007, in the Korean Intellectual Property Office (KIPO), the disclosure of which is incorporated herein in its entirety by reference.

BACKGROUND

1. Field

Example embodiments relate to an encoding system and method for encoding error control codes within bit streams, for example, an encoding system and method for improving an error correcting capability within a channel.

2. Description of Related Art

Generally, a path for transmitting information may be referred to as a channel. Information may be transmitted within the channel through wired or wireless communication means. Furthermore, a channel may be referred to as storing information in a semiconductor memory device and reading the stored information from the semiconductor memory device. For instance, the channel may be a temporal lapse from storing the information in the semiconductor memory device until reading the information from the semiconductor memory device. Also, the channel may be a physical path for storing information in the semiconductor memory device and reading the stored information from the semiconductor memory device.

When information is transmitted through the channel, the transmitted information may become corrupted and may include a number of errors. If the number of errors in the transmitted information exceeds a predetermined number of errors, a decoder may not be able to restore the initial transmission.

Currently, research efforts are continuing in the area of detecting error from corrupted information and eliminating the corrupted information from the initial transmission. Encoding error control codes may be referred to as a process of adding error control codes to initial information prior to transmitting. Decoding error control codes may be referred to as a process of separating the error control codes from the received transmission information in order to restore the initial information.

Depending on the channel response to transmitted information, an error rate in the channel may be relatively large. As the error rate increases, hardware complexity for encoding and decoding error control codes may increase in order to overcome the error and achieve the desired performance. Furthermore, when the channel is a multi-bit memory device, an increasingly number of errors may occur due to the channel response.

SUMMARY

Example embodiments may provide an apparatus and method for improving an error correcting capability within a channel that is a multi-bit memory device by preventing an error occurrence from concentrating in a particular data region through data shuffling and/or randomizing.

According to example embodiments, an encoding system for encoding error control codes may include a first encoder configured to encode an input bit stream to generate first bit streams of C-bits, wherein C is an integer greater than or equal to 1, and a second encoder configured to receive first bit streams and shuffle data of the received first bit streams to generate second bit streams, wherein an error distribution of the second bit streams may be adjusted based on the data shuffling.

According to example embodiments, a system for encoding and decoding error control codes an include an Error Control Code (ECC) encoder configured to encode an input bit stream to generate first bit streams; a shuffler configured to receive the first bit streams to generate second bit streams; a randomizer configured to receive the second bit streams and randomize the received second bit streams to generate third bit streams; a memory channel configured to receive the third bit streams and convert the third bit streams to fourth bit streams; a de-randomizer configured to receive the fourth bit streams and de-randomize the fourth bit streams to generate fifth bit streams; a de-shuffler configured to receive the fifth bit streams and de-shuffle the fifth bit streams to generate sixth bit streams; and an ECC decoder configured to receive the sixth bits streams and decode the received sixth bit streams to generate seventh bit streams.

According to example embodiments, an encoding method may include encoding an input bit stream to generate first bit streams of C-bits, and receiving the first bit streams and shuffling data of the received first bit streams to generate second bit streams, wherein an error distribution of the second bit streams may be adjusted based on the data shuffling.

BRIEF DESCRIPTION OF THE DRAWINGS

The above and/or other aspects, and advantages will become more apparent from the following detailed description of example embodiments, taken in conjunction with the accompanying drawings, in which.

DETAILED DESCRIPTION OF EXAMPLE EMBODIMENTS

Figure 1:
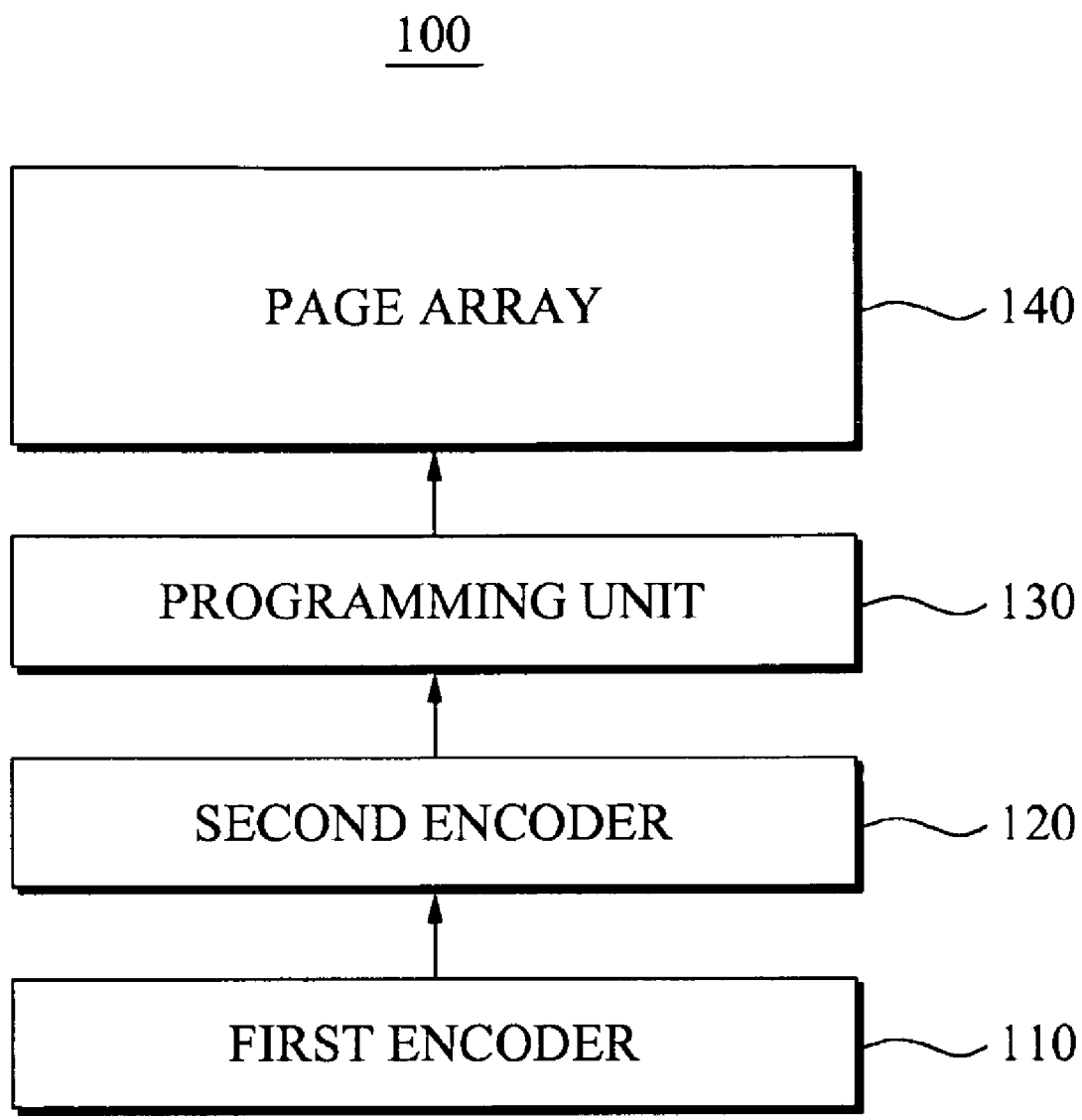
FIG. 1 is a block diagram illustrating an encoding system according to example embodiments.

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a block diagram illustrating an encoding system 100 according to example embodiments. Referring to FIG. 1, the encoding system 100 may include a first encoder 110 and a second encoder 120. The first encoder 110 may encode an N-bit input bit stream to generate first bit streams of C-bits. C and N may be integers greater than zero. The generated first bit streams may include a C-bit codeword. When C>N, redundant bits (C−N) may be assigned to the input bit stream.

The second encoder 120 may receive M first bit streams from the first encoder 110. The second encoder 120 may shuffle data of the received M first bits streams to generate M second bits streams. M may be an integer greater than zero. The second encoder 120 may also perform parity addition to the received M first bit streams. For instance, the second encoder 120 may add P-bit redundant information or parity to the first bit streams of C-bits. The second encoder 120 may encode the first bit streams of C-bits to generate second bit streams of (C+P) bits.

The second encoder 120 may also encode M first bit streams and each of the first bit streams may consist of C-bits. The second encoder 120 may shuffle data of bits streams of M×C bits to generate M second bit streams. Accordingly, the second encoder 120 may simultaneously encode M×C bit information.

The encoding system 100 may further include a programming unit 130. The programming unit 130 may program the second bit streams in a page array 140, wherein the page array 140 includes C-bit multi-bit cells. Each of the second bit streams may include C-bits and one-bit data which may be programmed in a single multi-bit cell. The programming unit 130 may perform a page programming operation M times and thereby store M-bit data in each multi-bit cell.

Furthermore, the programming unit 130 may perform a page programming operation L times and thereby store L-bit data in each multi-bit cell. L may be an integer greater than zero. The second encoder 120 may receive (L×K) first bit streams that are stored in the multi-bit cells connected to K word lines, wherein M=L×K. M, L and K may be integers greater than zero. The second encoder 120 may shuffle data of the M first bit streams to generate M second bit streams.

According to example embodiments, a single page array may include C multi-bit cells and the encoding system 100 may encode an N-bit codeword. For example, when C=1024 and N=100, the encoding system 100 may divide the input bit stream into 100-bit codeword units and perform encoding with respect to each codeword. The encoding system 100 may perform the encoding process ten times with respect to the single page array, and program a predetermined value with respect to other remaining 24 multi-bit cells.

Equations 1 through 3 (shown below) depict a process for encoding the M first bit streams to generate the M second bit streams by the second encoder 120 using a generator matrix G $$v=[B[0]B[1]\ldots B[C-1]B[C]\ldots B[(M-1)C-1]], \quad \text{Equation 1}$$

wherein v may express the M first bit streams as a single row vector.

$$w=[S[0]S[1]\ldots S[C+P-1]S[C+P]\ldots S[(M-1)(C+P)-1]], \quad \text{Equation 2}$$

wherein w may express the M second bit streams as a single row vector.

$$w=v\times G \quad \text{Equation 3}$$

The generator matrix G may be an MC×M(C+P) matrix, and the row vector w may be generated by multiplying the row vector v by the generator matrix G Equation 4 illustrates (as shown below) example embodiments of the generator matrix G, when M=2, C=2, and P=1.

$$G = \begin{bmatrix} 1 & 0 & 0 & 0 & | & 1 \\ 0 & 0 & 1 & 0 & | & 0 \\ 0 & 1 & 0 & 0 & | & 1 \\ 0 & 0 & 0 & 1 & | & 0 \end{bmatrix}. \quad \text{Equation 4}$$

According to example embodiments, the generator matrix G may correspond to parity addition and data shuffling for the first bit streams. For instance, when P=0, the generator matrix G may perform only data shuffling without the parity addition to the first bit streams. A number of bits that constitute the codeword of the first bit streams may be different from a number of multi-bit cells included in a single page array. For explanatory purposes only, it may be assumed that the number of bits of the codeword of the first bit streams and the number of bits of the multi-bit cells are C.

Figure 2:
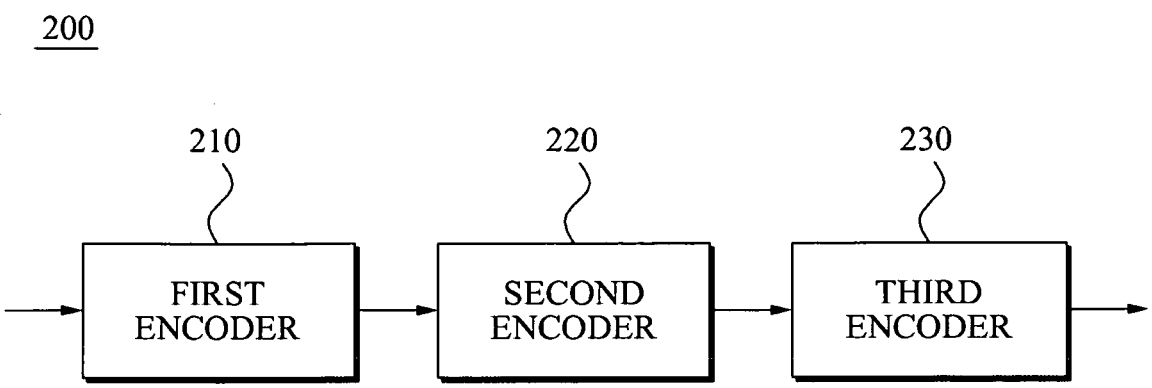
FIG. 2 is a block diagram illustrating another encoding system according to example embodiments.

FIG. 2 is a block diagram illustrating another encoding system 200 according to example embodiments. Referring to FIG. 2, the encoding system 200 may include a first encoder 210, a second encoder 220, and a third encoder 230. The first encoder 210 and the second encoder 220 may operate in the same manner as the first encoder 110 and the second encoder 120 of FIG. 1. Therefore, the details and operation of the first decoder 210 and the second decoder 220 are omitted for the sake of brevity.

The third encoder 230 may receive the second bit streams from the second encoder 220, and may randomize the received bit streams to generate third bit streams. The third encoder 230 may randomize the second bit streams using randomizer polynomial f(X). The process of randomizing the second bit streams using the randomizer polynomial f(X) will be further explained with reference to FIG. 9.

Figure 3:
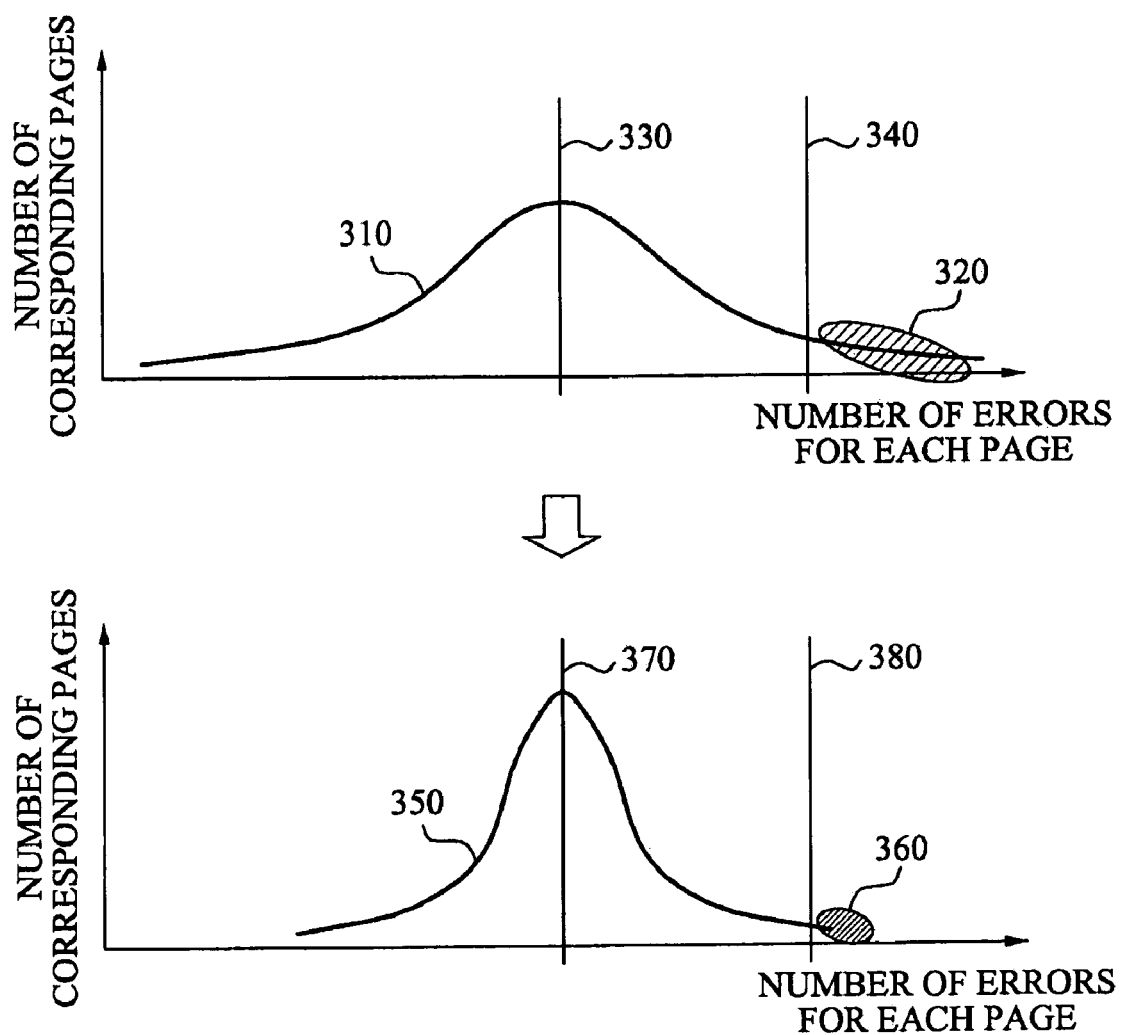
FIG. 3 illustrates graphs depicting a process for improving the error correctability according to example embodiments.

FIG. 3 illustrates graphs depicting a process for improving the error correctability of the encoding system 100 of FIG. 1 according to example embodiments. Referring to FIG. 3, a horizontal axis may denote a number of errors for each page and a vertical axis may denote the number of pages that include the number of errors corresponding to the horizontal axis. Because each of the multi-bit cells stores M-bit data, the single page array may store (C×M) bits of data. A single page array may include C multi-bit cells, where C-bit data may be simultaneously programmed in the single page array. The operation of programming the single page in the page array may refer to a page programming operation. For explanation purposes only, it is assumed that the second bit streams may be programmed in a single page array, wherein other bit streams (e.g., first, third, fourth, fifth, etc.) may be programmed in the single page array within the example embodiments. After the single page is programmed in the page array, a multi-bit memory device may read a stored page from the page array.

According to example embodiments, the multi-bit memory device may insert error control codes (ECC) into the page array in order to verify whether the read page matches the programmed page. The multi-bit memory device may determine whether an error may be included in the read page according to a predetermined ECC rule. Then, the multi-bit memory device may determine how many errors are included in the read page. If errors in the read page are fewer than the maximum number of errors permitted, the multi-bit memory device may correct the errors on the page. The maximum number of errors permitted to be corrected may be referred to as the maximum error correcting capability.

Referring to FIG. 3, a first distribution 310 may denote a distribution of pages corresponding to the number of errors in the first bit streams. A second distribution 350 may denote a distribution of pages corresponding to the number of errors in the second bit streams. A mean value of the number of errors in the first bit streams is shown with reference to line 330. A mean value of the number of errors in the second bit streams is shown with reference to line 370.

A maximum error correcting capability of the first bit streams is shown with reference to line 340, while a maximum error correcting capability of the second bit streams is shown with reference to line 380. A third distribution 320 may denote a number of pages where the multi-bit memory device cannot correct an error with respect to the first bit streams. A fourth distribution 360 may denote a number of pages where the multi-bit memory device cannot correct an error with respect to the second bit streams.

The second encoder 120 may adjust the error distribution of a page unit through data shuffling and thereby ensure data with an error rate within the error correcting capability. For example, with respect to the first bit streams, the second encoder 120 of FIG. 1 may shuffle data of the pages that include errors greater than the number of errors indicated by line 330 with other pages that include errors less than the number of errors indicated by line 330.

The second encoder 120 may prevent the error occurrence from concentrating in a particular data region through data shuffling, and may equalize the error rate for each page. For instance, referring to FIG. 3, the fourth distribution 360 may be smaller than the third distribution 320, which may indicate that the error correctability has improved.

Figure 4:
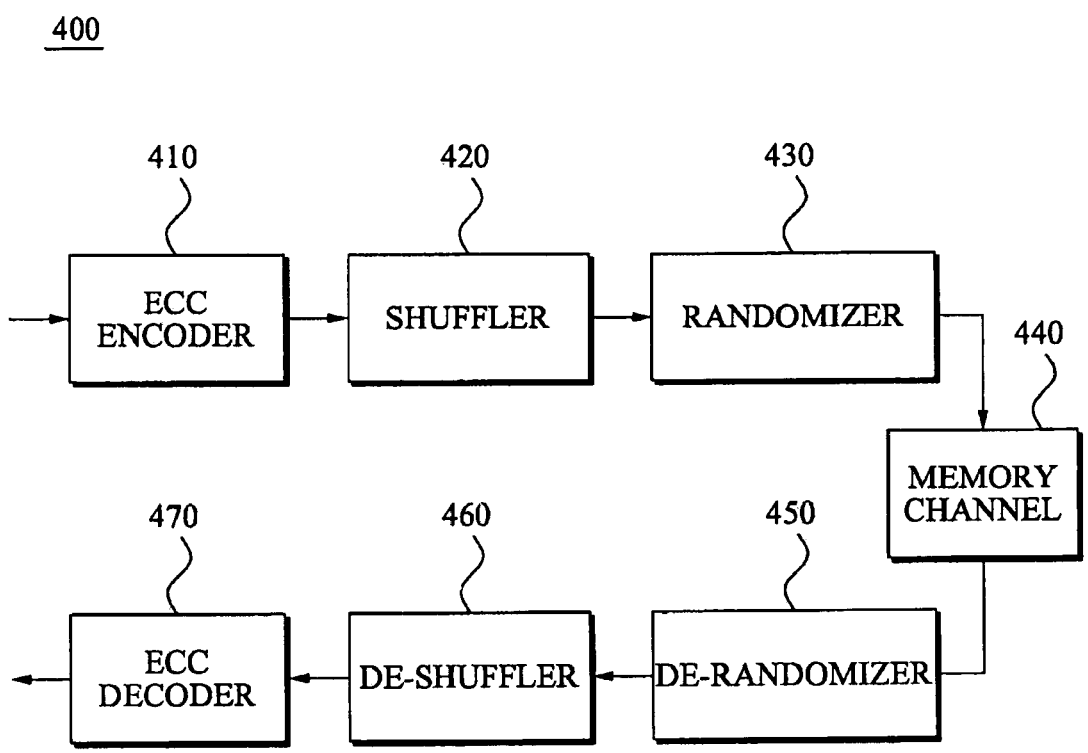
FIG. 4 is a block diagram illustrating a system that includes an error control code (ECC) encoder and an ECC decoder according to example embodiments.

FIG. 4 is a block diagram illustrating a system 400 that includes an ECC encoder 410 and an ECC decoder 470 according to example embodiments. Referring to FIG. 4, the system 400 may include the ECC encoder 410, a shuffler 420, a randomizer 430, a memory channel 440, a de-randomizer 450, a de-shuffler 460, and the ECC decoder 470. The ECC encoder 410 may receive an input bit stream and encode the received bit stream to generate first bit streams. The shuffler 420 may receive M first bit streams and shuffle the received M first bit streams to generate M second bit streams.

The randomizer 430 may receive the second bit streams and may randomize the received second bit streams to generate the third bit streams. The third bit streams may be transmitted to the memory channel 440 and be converted to fourth bit streams by the memory channel 440.

The memory channel 440 may be a temporal lapse from storing data in the memory device until reading the stored data. Also, the memory channel 440 may be a process for storing data in the memory device and reading the data from the memory device. A difference between the third bit streams and the fourth bit streams may be an error of the fourth bit streams. The de-randomizer 450 may receive the fourth bit streams and may de-randomize the received fourth bit streams to generate a fifth bit streams. The de-randomizing process may be a process of inversely performing the randomizing process.

The de-shuffler 460 may receive the fifth bit streams and may de-shuffle the received fifth bit streams to generate sixth bit streams. The de-shuffling process may be a process of inversely performing the shuffling process. The ECC decoder 470 may receive the sixth bit streams and may decode the received sixth bit streams to generate seventh bit streams.

When errors included in the sixth bit streams are fewer than the maximum error correcting capability, the ECC decoder 470 may correct the errors included in the sixth bit streams. The ECC decoder 470 may correct the errors included in the sixth bit streams to generate error-free seventh bit streams.

Referring again to FIG. 1, the second encoder 120 may shuffle data of the first bit streams to generate the second bit streams. The process for generating the second bit streams by the second encoder 120 will be described with reference to FIGS. 5 and 6.

Figure 5:
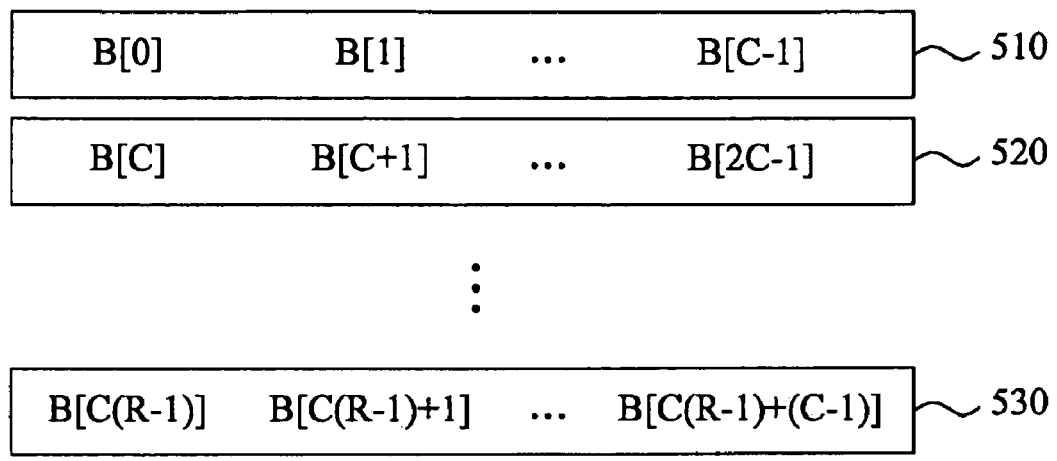
FIG. 5 illustrates example embodiments of first bit streams.

FIG. 5 illustrates an example of first bit streams according to example embodiments. Referring to FIG. 5, R first bit streams are provided. R may be an integer greater than zero. The first bit streams may include bit streams 510, 520 and

530. The bit stream 510 may be a bit stream of C-bits that may include B[0] through B[C−1]. The bit stream 520 may be a bit stream of C-bits that may include B[C] through B[2C−1]. The bit stream 530 may be a bit stream of C-bits that may include B[C(R−1)+(C−1)].

Figure 6:
FIG. 6 illustrates a process for generating second bit streams according to example embodiments.
Figure 6:
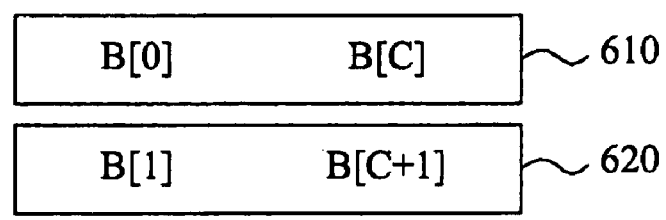

FIG. 6 illustrates a process for generating second bit streams by the second encoder 120 of FIG. 1 according to example embodiments. Referring to FIG. 6, the generated second bit streams may include bit streams 610 and 620. An $i^{th}$ element, Si, of the second bit streams may be obtained from a $j^{th}$ element, B[j], of the first bit streams according to Equation 6 shown below.

$$j=(i \times C+D) \bmod (M \times C), Si=B[j],  \quad \text{Equation 6}$$

wherein D may be an offset of the shuffling process. A mod B may be a modulo operation that may indicate a remainder obtained by dividing A by B.

Referring to FIG. 6, example embodiments may demonstrate a data shuffling process when M=2. D may be adjusted according to i in the data shuffling process. According to example embodiments, D=0 may be set with respect to i from 0 to M−1, and D=1 may be set with respect to i from M to 2M−1. With respect to S0, since j=0 mod 2C=0, the relation where S0=B[0] may be formed. With respect to S1, since j=C mod 2C=C, the relation where S1=B[C] may be formed. The second encoder 120 may generate the bit stream 610 that includes S0 and S1. With respect to S2, since j=1 mod 2C=1, the relation where S2=B[1] may be formed. With respect to S3, since j=(C+1) mod 2C=C+1, the relation where S2=B[C+1] may be formed. The second encoder 120 may generate the bit stream 620 that includes S2 and S3.

Figure 7:
FIG. 7 illustrates another process for generating a second bit stream by a second encoder according to example embodiments.
Figure 7:
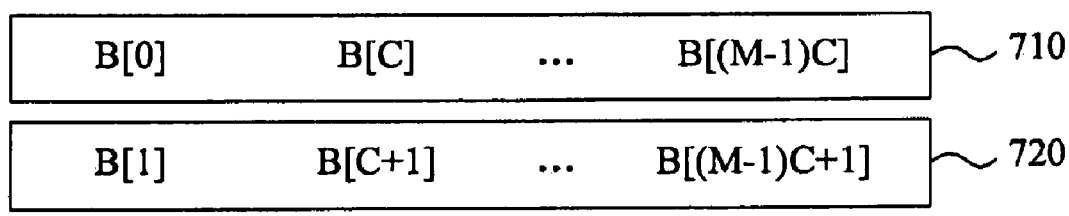

FIG. 7 illustrates another process for generating second bit streams by the second encoder 120 of FIG. 1 according to example embodiments. Referring to FIG. 7, the generated second bit streams may include bit streams 710 and 720. According to example embodiments, D=0 may be set with respect to i from 0 to M−1, and D=1 may be set with respect to i from M to 2M−1. With respect to S0, since j=0 mod(M×C)=0, the relation where S0=B[0] may be formed. With respect to S1, since j=C mod(M×C)=C, the relation where S1=B[C] may be formed. With respect to S2, since j=2C mod(M×C)=2C, the relation where S2=B[2C] may be formed. With respect to S3, since j=3C mod(M×C)=3C, the relation where S3=B[3C] may be formed. With respect to S(M−1), since j={(M−1)×C} mod(M×C)=(M−1)×C, the relation where S(M−1)=B[(M−1)C] may be formed.

The second encoder 120 may generate the bit stream 710 that includes S0, S1, S2, S3, and S(M−1). With respect to S(M), since j=(M×C+1) mod(M×C)=1, the relation where S(M)=B[1] may be formed. With respect to S(M+1), since j={(M+1)×C+1} mod(M×C)=C+1, the relation where S(M+1)=B[C+1] may be formed. With respect to S(M+2), since j={(M+2)×C+1} mod(M×C)=2C+1, the relation where S(M+2)=B[2C+1] may be formed. With respect to S(M+3), since j={(M+3)×C+1} mod(M×C)=3C+1, the relation where S(M+3)=B[3C+1] may be formed. With respect to S(2M−1), since j={(2M−1)×C} mod(M×C)=(M−1)C+1, the relation where S(2M−1)=B[(M−1)C+1] may be formed.

The second encoder 120 may generate the bit stream 720 that includes S(M), S(M+1), S(M+2), S(M+3), and S(2M−1). According to example embodiments, the second encoder 120 may generate the second bit streams that include C-bits of S0, S1, S(C−1). When C is significantly larger than M, the second encoder 120 may generate C-bit second bit streams that includes S0, S1, S(M−1), S(M), S(M+1), ..., S(2M), ..., S(3M), ..., S(C−1).

According to example embodiments, the second encoder 120 may shuffle data stored in multi-bit cells of a single page array. Each multi-bit cell may store M-bit data and the single page array may store (M×C) bits of data. Data may be stored by performing the page programming operation M times with respect to the single page array.

According to example embodiments, the second encoder 120 may shuffle data stored in multi-bit cells of K page arrays. Each multi-bit cell may store L-bit data and the single page array may store (L×C) bits of data. Data may be stored by performing the page programming operation L times with respect to the single page array. The relation where M=L×K may be formed among M, L, and K, where M, L and K may be integers greater than zero.

Figure 8:
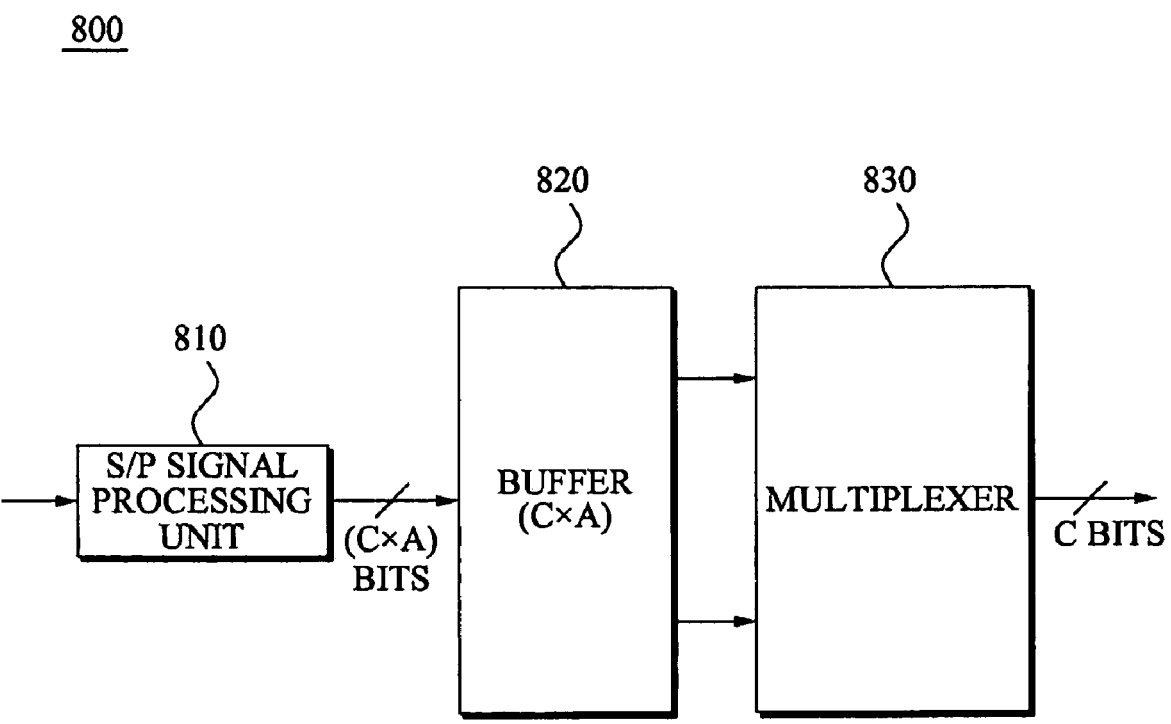
FIG. 8 is a block diagram illustrating a second encoder according to example embodiments.

FIG. 8 is a block diagram illustrating a second encoder 800 according to example embodiments. Referring to FIG. 8, the second encoder 800 may include a serial/parallel (S/P) signal processing unit 810, a buffer 820, and a multiplexer 830. The S/P signal processing unit 810 may receive A first bit streams and perform S/P signal processing with respect to the received input bit streams to generate bit streams of (C×A) bits. A may be an integer greater than zero. The buffer 820 may store the bit streams of (C×A) bits and transfer the stored bit streams to the multiplexer 830. The multiplexer 830 may perform A-to-one multiplexing. The multiplexer 830 may multiplex the bit streams of (C×A) bits to generate C-bit second bit streams.

Figure 9:
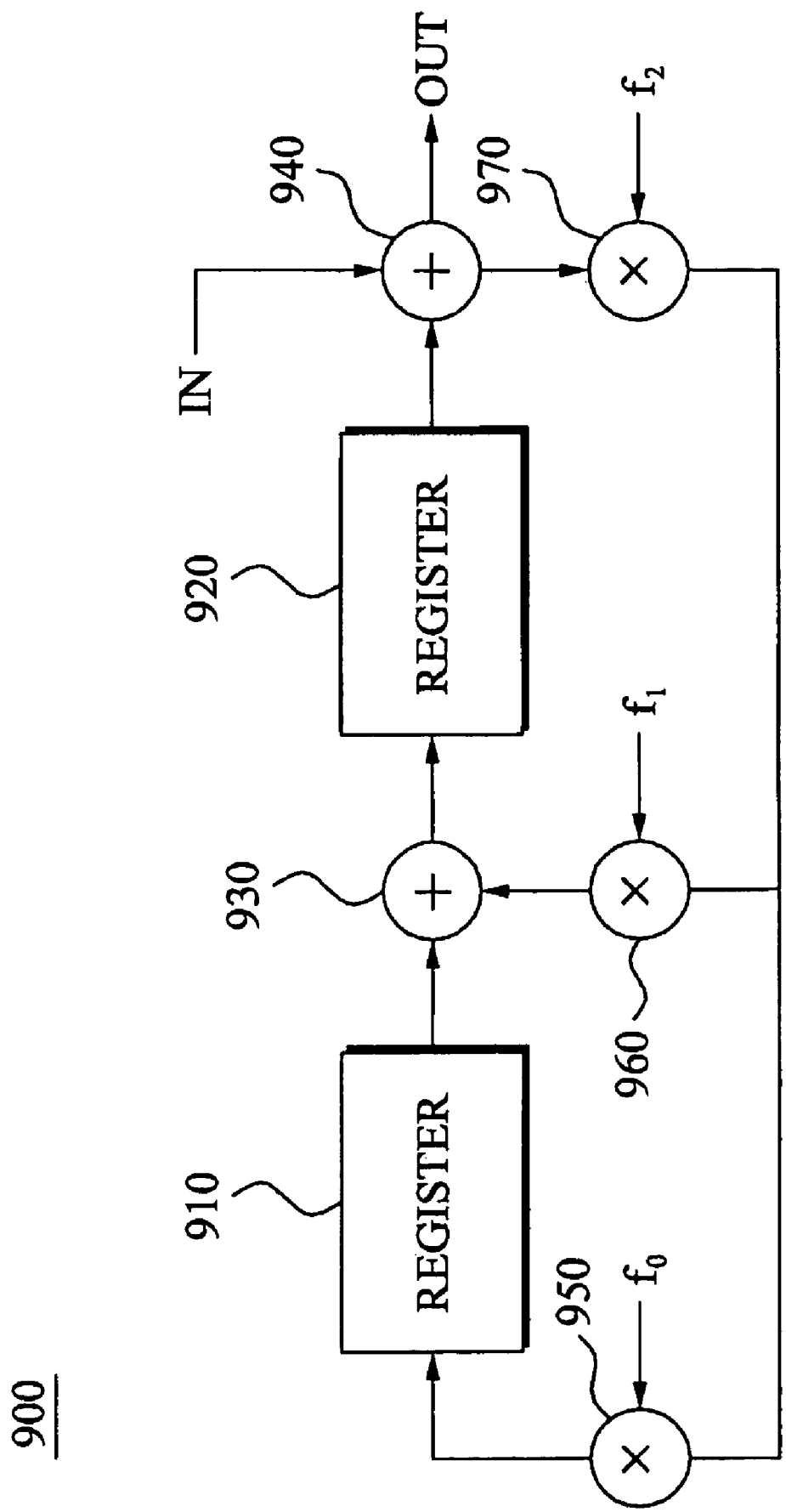
FIG. 9 is a block diagram illustrating a third encoder according to example embodiments.

FIG. 9 illustrates a third encoder 900 according to example embodiments. A randomizing process may be performed by the third encoder 900. The randomizing process may include randomizer polynomial $f(X)=f_0+f_1 X+f_2 X^2+ \ldots +f_n X^n$, wherein $f_0, f_1, \ldots, f_n$ are coefficients of the polynomial.

Referring to FIG. 9, the third encoder 900 may include a first register 910 and a second register 920, a first modulo adder 940, and a plurality of multipliers (e.g., 950, 960, and 970). A modulo adder 940 may receive the second bit streams and perform a modulo addition with respect to the received second bit streams and the output of the first register 920 to generate third bit streams. Output bit streams of the modulo adder 940 may be transferred to a multiplier 970.

The multiplier 970 may multiply the output bit streams of the modulo adder 940 and coefficient $f_2$, and transfer the result of the multiplication to other multipliers 950 and 960. The multiplier 950 may multiply the results of the multiplier 970 and coefficient $f_0$, and transfer the result of the multiplication to the first register 910. The multiplier 960 may multiply the results of the multiplier 970 and coefficient $f_1$, and transfer the result of the multiplication to the modulo adder 930. The modulo adder 930 may add up the output of the first register 910 and the output of the multiplier 960 and transfer the result of the addition to the second register 920. The results of the second register 920 may be added to the second bit streams to produce the third bit streams.

Figure 10:
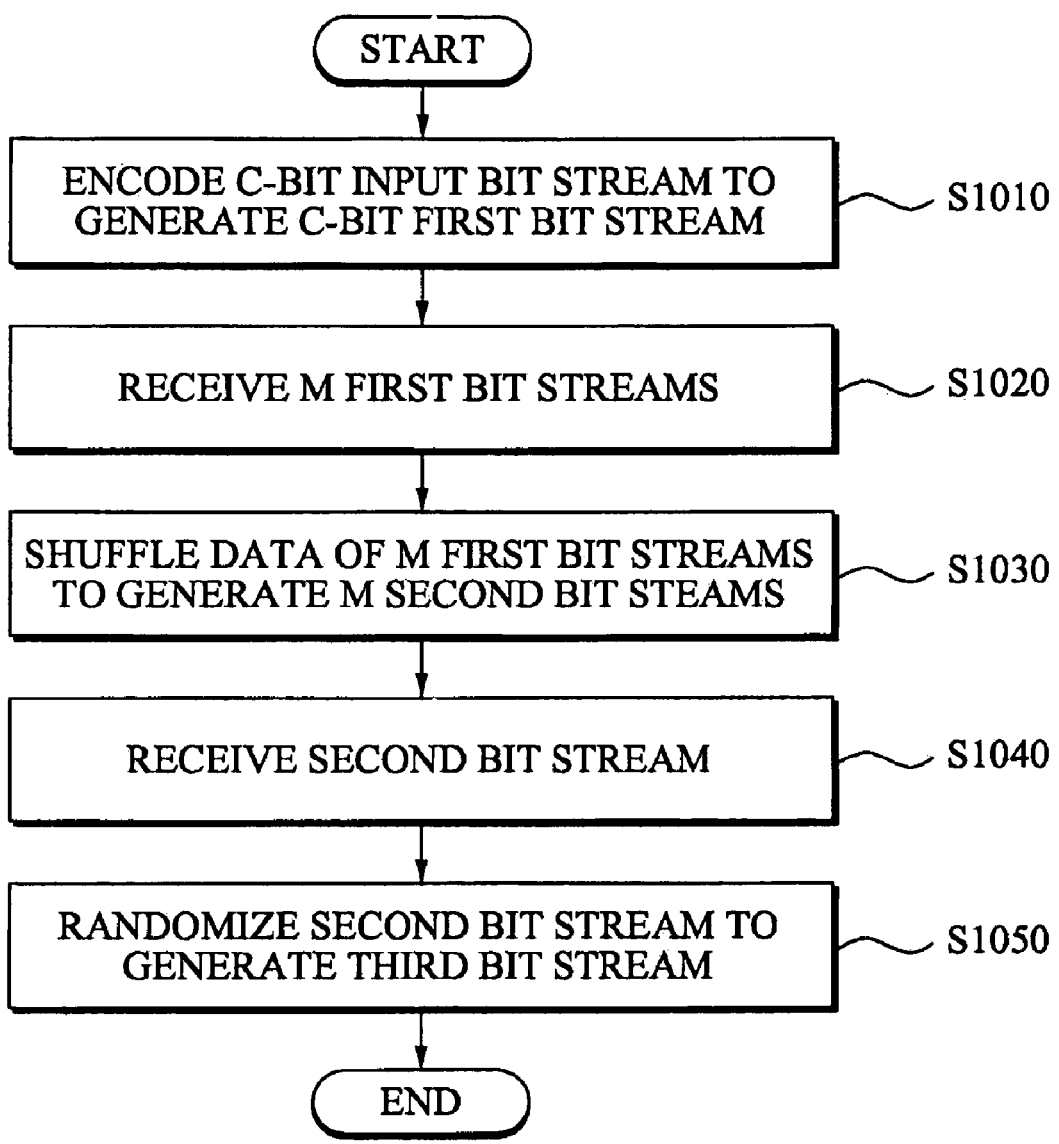
FIG. 10 is a flowchart illustrating an encoding method according to example embodiments.

FIG. 10 is a flowchart illustrating an encoding method according to example embodiments. Referring to FIG. 10, in operation S010, the encoding method may encode a C-bit input bit stream to generate first bit streams of C-bits. In operation S11020, the encoding method may receive M first bit streams. In operation S1030, the encoding method may shuffle data of the received M first bit streams to generate M second bit streams. In operation S1040, the encoding method may receive the second bit streams. In operation S1050, the encoding method may randomize the received second bit streams to generate third bit streams. According to example embodiments, the encoding method may program the second bit streams in a page array that includes C multi-bit cells. Each multi-bit cell may store M-bit data.

According to example embodiments, an $i^{th}$ element, Si, of the second bit streams may be obtained from a $j^{th}$ element, B[j], of the first bit streams according to Equation 7 shown below.

$$j=(i \times C+D) \bmod (M \times C), Si=B[j], \quad \text{Equation 7}$$

wherein D may be an offset of the shuffling process. A mod B is a modulo operation that indicates a remainder obtained by dividing A by B.

The encoding method according to example embodiments may be recorded in a computer-readable media including program instructions to implement various operations embodied by a computer, for example. The media may also include, alone or in combination with the program instructions, data files, and data structures, for example. Examples of computer-readable media may include magnetic media such as hard disks, floppy disks, and magnetic tape, for example; optical media such as CD ROM disks, and DVD, for example; magneto-optical media such as optical disks; and hardware devices such as read-only memory (ROM), random access memory (RAM), and flash memory, for example. Examples of program instructions may include both machine code, such as produced by a compiler, and files containing higher level code that may be executed by the computer using an interpreter, for example. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP), for example.

The flash memory devices and/or the memory controllers may constitute memory cards. In this case, the memory controllers may be constructed to communicate with an external device, for example, a host using any one of various types of protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE), for example.

The flash memory devices may be non-volatile memory devices that can maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage, for example. The flash memory devices may be used in home applications such as a high definition television (HDTV), a digital video disk (DVD), a router, and a Global Positioning System (GPS), for example.

A computing system according to example embodiments may include a microprocessor that is electrically connected with a bus, a user interface, a modem such as a baseband chipset, a main controller, and a flash memory device, for example. The flash memory device may store N-bit data via the main controller. The N-bit data may be processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), and a mobile Dynamic Random Access Memory (DRAM), and for example. The main controller and the flash memory device may constitute a solid state drive/disk (SSD) that may use a non-volatile memory to store data.

While example embodiments have been particularly shown and described, it will be understood by those of ordinary skill in the art that various changes in form and details may be made therein without departing from the spirit and scope of the present invention as defined by the following claims.

What is claimed is:

1. An encoding system for encoding error control codes, the encoding system comprising:
  a first encoder configured to encode an input bit stream to generate first bit streams of C-bits, wherein C is an integer greater than zero; and
  a second encoder configured to receive the first bit streams and shuffle data of the received first bit streams to generate second bit streams, wherein an error distribution of the second bit streams is adjusted based on the data shuffling; and
  wherein the second encoder shuffles data of a single page array that include errors greater than a mean value of a number of errors in the first bit streams with other page arrays that include errors fewer than the mean value of the number of errors in the first bit streams.

2. The encoding system of claim 1, wherein the second encoder adds redundant information to the received first bit streams of C-bits.

3. The encoding system of claim 2, wherein the second encoder adds the redundant information to the received first bit streams of C-bits and shuffles data of the received first bit streams based on a generator matrix.

4. The encoding system of claim 1, wherein the second encoder comprises:
  a serial/parallel (S/P) signal processing unit configured to receive the first bit streams and perform signal processing to generate C×A bit streams, wherein A is an integer greater than zero;
  a buffer configured to store the C×A bit streams; and a multiplexer configured to multiplex the stored C×A bit streams to generate the second bit streams.

5. The encoding system of claim 1, further comprising:
  a third encoder configured to receive the second bit streams and randomize the received second bit streams to generate third bit streams.

6. The encoding system of claim 5, wherein the third encoder comprises:
  a modulo adder configured to receive the second bit streams and perform a modulo addition to generate the third bit streams;
  a plurality of multipliers configured to receive the third bit streams and multiply the third bit streams by randomizer polynomial coefficients; and
  a first and second register configured to store the results of the plurality of multipliers.

7. The encoding system of claim 5, wherein the third encoder randomizes the received second bit streams to generate the third bit streams based on a randomizer polynomial, wherein the randomizer polynomial includes $f(X)=f_0+f_1X+f_2X^2+ \ldots +f_nX^n$, wherein $f_0, f_1, \ldots, f_n$ are the randomizer polynomial coefficients.

8. The encoding system of claim 1, further comprising:
a programming unit configured to program the second bit streams in a page array, the page array includes a plurality of multi-bit cells, wherein each of the multi-bit cells stores M-bit data, wherein M is an integer greater than zero.

9. The encoding system of claim 1, further comprising:
a programming unit configured to program the second bit streams in a page array, the page array includes a plurality of multi-bit cells, wherein each of the multi-bit cells stores L-bit data, and the second encoder generates M second bit streams to be stored in the multi-bit cells connected with K word lines, wherein M=L×K and M, L and K are integers greater than zero.

10. The encoding system of claim 1, wherein an $i^{th}$ element, Si, of the second bit streams is obtained from a $j^{th}$ element, B[j], of the first bit streams according to j=(I×C+D) mod(M×C) and Si=B[j], wherein D is an offset of the shuffling process and mod is a modulo operation.

11. The encoding system of claim 10, wherein the $i^{th}$ element, Si, of the second bit streams is obtained by adjusting i of the offset D.

12. A system for encoding and decoding error control codes, the system comprising:
an Error Control Code (ECC) encoder configured to encode an input bit stream to generate first bit streams;
a shuffler configured to receive the first bit streams and shuffle data of the received first bit streams to generate second bit streams, wherein the shuffler shuffles data of a single page array that include errors greater than a mean value of a number of errors in the first bit streams with other page arrays that include errors fewer than the mean value of the number of errors in the first bit streams;
a randomizer configured to receive the second bit streams and randomize the received second bit streams to generate third bit streams;
a memory channel configured to receive the third bit streams and convert the third bit streams to fourth bit streams;
a de-randomizer configured to receive the fourth bit streams and de-randomize the fourth bit streams to generate fifth bit streams;
a de-shuffler configured to receive the fifth bit streams and de-shuffle the fifth bit streams to generate sixth bit streams; and
an ECC decoder configured to receive the sixth bit streams and decode the received sixth bit streams to generate seventh bit streams.

13. The system of claim 12, wherein the ECC decoder corrects errors in the sixth bit streams if the errors included in the sixth bit streams are fewer than a maximum error correcting capability of the system.

14. The system of claim 12, wherein the ECC decoder corrects errors in the sixth bit streams and generates error free seventh bit streams.

15. An encoding method comprising:
encoding an input bit stream to generate first bit streams of C-bits, wherein C is an integer greater than zero; and
receiving the first bit streams and shuffling data of the received first bit streams to generate second bit streams, wherein the data of a single page array that include errors greater than a mean value of a number of errors in the first bit streams is shuffled with other page arrays that include errors fewer than the mean value of the number of errors in the first bit streams.

16. The method of claim 15, further comprising:
receiving the second bit streams and randomizing the received second bit streams to generate third bit streams.

17. The method of claim 15, further comprising:
programming the second bit streams in a page array that includes a plurality of multi-bit cells, wherein each of the multi-bit cells stores M-bit data, wherein M is an integer greater than zero.

18. The method of claim 15, wherein an $i^{th}$ element, Si, of the second bit streams is obtained from a $j^{th}$ element, B[j], of the first bit streams according to j=(I×C+D) mod(M×C) and Si=B[j], wherein D is an offset of the shuffling process and mod is a modulo operation.

19. The method of claim 18, wherein the $i^{th}$ element, Si, of the second bit streams is obtained by adjusting i of the offset D.

20. A computer-readable recording medium storing a program for implementing the method of claim 15.

* * * * *